United States Patent [19]
Friend et al.

[11] Patent Number: 5,965,979
[45] Date of Patent: Oct. 12, 1999

[54] MANUFACTURE OF ORGANIC LIGHT EMITTING DEVICES

[75] Inventors: Richard Henry Friend; Andrew Bruce Holmes; Stephen Carl Moratti, all of Cambridge, United Kingdom

[73] Assignee: Cambridge Display Technology Limited, Cambridge, United Kingdom

[21] Appl. No.: 08/930,230

[22] PCT Filed: Apr. 17, 1996

[86] PCT No.: PCT/GB96/00923

§ 371 Date: Sep. 2, 1997

§ 102(e) Date: Sep. 2, 1997

[87] PCT Pub. No.: WO96/33593

PCT Pub. Date: Oct. 24, 1996

[30] Foreign Application Priority Data

Apr. 18, 1995 [GB] United Kingdom .................... 9507857
Jul. 26, 1995 [GB] United Kingdom .................... 9515298

[51] Int. Cl.$^6$ ............................. H05B 33/10; H05B 33/14
[52] U.S. Cl. ............................................... 313/504; 156/67
[58] Field of Search .............................. 313/504; 156/67; 428/690

[56] References Cited

U.S. PATENT DOCUMENTS

| | | | |
|---|---|---|---|
| 3,376,177 | 4/1968 | Browser et al. ........................... | 156/67 |
| 5,247,190 | 9/1993 | Friend et al. ............................. | 313/504 |
| 5,759,709 | 6/1998 | Doi et al. ................................. | 313/504 |
| 5,858,561 | 1/1999 | Epstein et al. ........................... | 313/504 |

FOREIGN PATENT DOCUMENTS

| | | |
|---|---|---|
| 0331997 | 9/1989 | European Pat. Off. . |
| 02312185 | 3/1991 | Japan . |
| 188592 | 11/1966 | U.S.S.R. . |
| 8912376 | 12/1989 | WIPO . |
| 9013148 | 1/1990 | WIPO . |

*Primary Examiner*—Kenneth J. Ramsey
*Attorney, Agent, or Firm*—Merchant & Gould, P.C.

[57] ABSTRACT

A method of making a light emitting device comprises the laminating together of two self-supporting components, at least one of which has a light emitting layer (12) on an inner surface thereof. A first self-supporting component is formed by coating a first substrate (10) with an organic light emissive material (12). A second self-supporting component is formed by coating a second substrate (2) with an organic material which is one of a light emissive material and a charge transport material (8). The two self-supporting components are laminated together such that the organic materials (8, 12) are located between the substrates (2, 10) in the finished device.

13 Claims, 3 Drawing Sheets

MANUFACTURE OF ORGANIC LIGHT EMITTING DEVICES

FIELD OF THE INVENTION

The field of the invention relates to the manufacture of organic light emitting devices.

BACKGROUND OF THE INVENTION

Early organic light emitting devices were fabricated by deposition of metallic electrodes on either side of a thin organic crystal, for example single crystal anthracene as described in U.S. Pat. No. 3,530,325. Because of the relatively large thickness of the crystal, and the requirement for application of high electric fields across the organic material, this resulted in the need for high voltage operation of the devices and therefore a reduction of the power efficiency of the devices. Also this approach is expensive due to the difficulties in fabricating thin crystal layers. As a result of these problems, successful attempts were made to deposit thin film organic molecular and oligomer materials by vacuum sublimation onto a substrate which already has an electrode coating. Reference is made to C. W. Tang, S. A. Van Slyke and C. H. Chen, J. Appl. Phys. 65, 3610 (1989) which describes the deposition of charge transport and emitting layers to make a light emitting device. Subsequent to deposition of the charge transport and emitting layers, a top metal electrode can be deposited by a vacuum coating technique (e.g. evaporation). The layers have a strict uniformity requirement that may be difficult to satisfy over large coating areas. However, the main disadvantage of this technique is the need to deposit the metal electrode by vacuum metallisation.

EP-A-331997 describes the manufacturing technique for an electroluminescent element in which the luminescent layer contains fluorescent material such as for example zinc sulphide. In that manufacturing technique, a back electrode is formed of an aluminium foil and carries an insulating layer and a luminescent layer. This composite is laminated to a transparent conductive film in the form of a continuous web.

The discovery that conjugated polymers could be made to exhibit electroluminescence, as described in our earlier U.S. Pat. No. 5,247,190 (herein incorporated by reference), allowed for different deposition techniques, namely the use of wet-film coating techniques such as spin-coating. These films can have better thermal and mechanical stability than sublimed molecular films. The deposition of a plurality of layers, however, requires careful selection of solvents and polymer systems to avoid redissolution of the previously deposited layers. Alternatively, soluble precursor polymers are deposited as wet films and subsequently converted (e.g. by heat treatment) to the final insoluble polymer form. The heat treatment has to avoid damage to any previous layers or substrates—in particular plastic substrates that are sued for flexibility and/or transparency can be prone to damage. One way around this is to deposit the precursor material on a flexible, high temperature resistance material such as a metal foil and then to deposit a transparent electrode after conversion. In this case the deposition conditions have to be carefully considered to allow a high quality transparent and conductive film to be produced.

One aim of the invention is to develop a technique for fabricating a multilayer organic light emitting device which avoids these problems.

SUMMARY OF THE INVENTION

According to a first aspect of the present invention there is provided a method of making a light emitting device comprising the laminating together of two self-supporting components, at least one of which has a light emitting layer on an inner surface thereof, whereby the light emitting layer is located between the components in the finished device, characterised in that: a first one of the self-supporting components is formed by coating a first substrate with an organic light emissive material; a second one of the self-supporting components is formed by coating a second substrate with an organic material which is one of a light emissive material and a charge transport material; and the step of laminating together the two self-supporting components is such that the organic materials are located between the substrates in the finished device.

The organic materials can be selected from organic semiconductive conjugated polymers. A range of suitable polymers is described for example in our U.S. Pat. No. 5,247,190, the contents of which are herein incorporated by reference. A particularly suitable semiconductive conjugated polymer is poly(phenylenevinylene) (PPV) or its derivatives. In that case, each of the self-supporting substrates provides a respective electrode for the light emitting device. Thus, one of the substrates may be aluminium and the other of the substrates may be glass or a transparent plastics material with a coating of indium tin oxide as the electrode. The light emissive layer has the property of emitting light when an electric field is applied between the electrodes. These electroluminescent qualities are discussed in detail in U.S. Pat. No. 5,247,190. Application of an electric field between the two electrodes on either side of the polymer layer cause charge carriers of opposite types to be injected into the polymer layer. These charge carriers recombine and decay radiatively causing light to be emitted. Electrodes other than indium tin oxide and aluminium can be used, provided that the work functions of the electrodes are selected to allow injection of charge carriers of opposite types into the polymer layer.

As an alternative to organic semiconductive conjugated polymers, organic molecular films may be utilised. Suitable molecular materials are disclosed in the reference referred to earlier in the name of C. W. Tang et al. The two substrates are typically laminated together by application of pressure and heat.

In accordance with the invention, more than one layer is laminated between the self-supporting substrates. The second substrate can carry a second light emitting layer for emitting light at a wavelength different to the organic light emissive material on the first substrate, or it can be a charge transport layer. A charge transport layer enhances the transfer of charge carriers (i.e. electrons or holes) from one of the electrodes to the light emitting layer to enhance the efficiency of light emission. Suitable charge transport layers in the form of semiconductive conjugated polymers are likewise described in our U.S. Pat. No. 5,247,190. In the described embodiment, PPV is used as the charge transport layer while cyanoPPV is used as the light emissive layer.

Other possible charge transport layers include conducting polymers such as polypyrrole, polyaniline, PPV and derivatives and polythiophene and derivatives. These are conjugated polymers which have been made conductive through doping. Doped polymers of this type may be solution processible or they may need to be deposited by some other means, for example by electrochemical deposition in situ. A solvent processible conducting form of polyaniline is disclosed in U.S. Pat. No. 5,232,631. This describes polyaniline which has been protonated (doped) with camphor sulfonic acid (PANI-CSA) and can be solution processed in m-cresol. Another possibility is a water soluble polymer complex of poly(ethylenedioxythiophene) and poly(styrenesulphonate).

One advantage of using such conducting polymers as the charge transport layer is that the interface between the conducting polymer layer and the light emissive layer has less critical energy requirements than when two semiconductive conjugated polymer layers are used adjacent one another. This in turn means that the lamination technique may be slightly more tolerant of process variations when a conducting polymer is used as the charge transport layer.

According to another aspect therefore of the present invention there is provided a method of making a light emitting device comprising the laminating together of two self-supporting components, at least one of which is formed by coating a first substrate with an organic light emissive material constituting a light emitting layer and a conducting polymer constituting a charge transport layer, whereby the light emitting layer and the charge transport layer are located between the components in the finished device.

Lamination of the self-supporting substrates with the layers therebetween can be by heating. However, with some materials it may be necessary to apply a layer of adhesive to ensure good adhesion between the layers carried by the self-supporting substrates.

Thus, according to another aspect of the invention there is provided an organic light emitting device comprising a self-supporting substrate acting as a first electrode and carrying a first organic layer, a second self-supporting substrate acting as a second electrode and carrying a second organic layer, and arranged between the first and second organic layers a layer of adhesive, wherein at least one of the first and second organic layers is a light emitting layer.

The invention is used to advantage to provide an easier method of fabricating organic light emitting diode devices, by laminating together two self-supporting substrates that either already have electrode layers deposited on them, or where one or both of the substrates directly act as the electrode layer. The fabrication process can therefore take place without vacuum metal deposition techniques. Also, multiple layer structures can be fabricated without concern for redissolution of the individual layers in the case of soluble organic materials. Also, in the situation where precursor molecular or polymer materials are used, the materials can be deposited on top of the more resistant substrate material.

BRIEF DESCRIPTION OF THE DRAWINGS

For a better understanding of the present invention and to show how the same may be carried into effect reference will now be made by way of example to the following drawings.

DESCRIPTION OF THE PREFERRED EMBODIMENT

Figure 3:
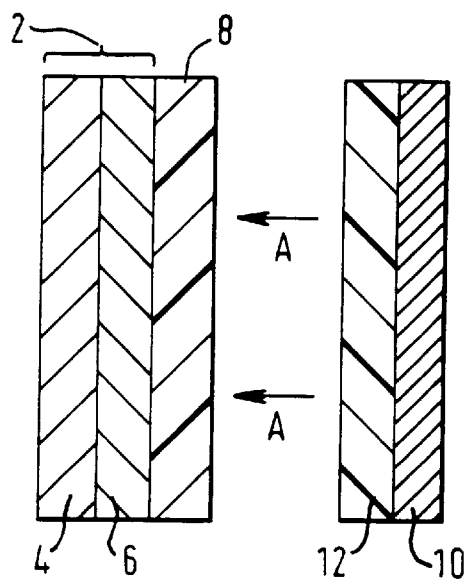
FIG. 3 is an exemplary structure in accordance with one embodiment of the invention.

FIG. 3 shows the structure of a multiple layer light emitting device fabricated in a specific embodiment.

Figure 1:
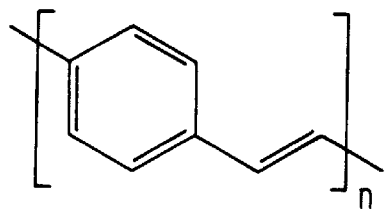
FIG. 1 is the chemical structure of a first polymer.

One self-supporting substrate 2 comprises a glass or transparent plastics material 4 carrying a coating 6 of indium tin oxide. The coating 6 of indium tin oxide acts as a first electrode for the finished device. The first self-supporting substrate 2 carries a layer 8 of a first polymer which acts as a charge transport compound. The structure of the first polymer is shown in FIG. 1 which represents poly (phenylenevinylene) (PPV).

Manufacture of the first self-supporting substrate 2 with its polymer coating 8 is the first step in the method described herein.

Figure 2:
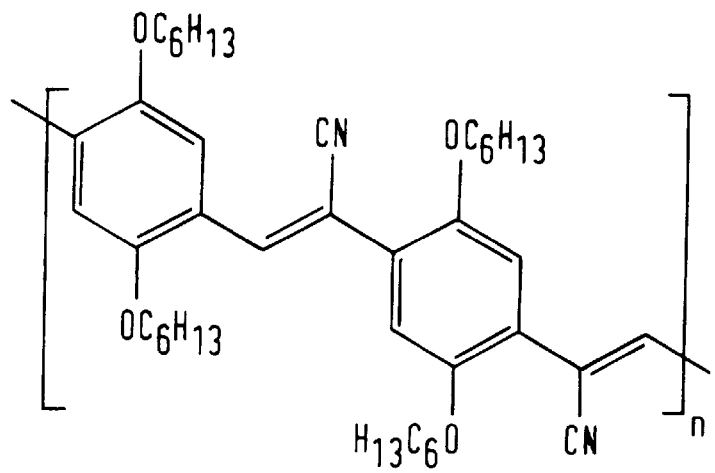
FIG. 2 is the chemical structure of a second polymer.

FIG. 3 also illustrates a second self-supporting substrate 10, in this case a thin sheet of aluminium foil. This carries a coating 12 of a second polymer layer, the structure of which is shown in FIG. 2. The second polymer layer is poly(cyanoterephthalylidene) which acts as a light emitting layer.

After individual manufacture of the first and second self-supporting substrates with their respective coatings, they are laminated together to form an electroluminescent device as indicated diagrammatically by the arrows A.

The first polymer coating 8 is deposited by spin coating a methanol solution of the sulfonium precursor to poly (phenylenevinylene) onto the indium tin oxide coated glass 4,6. This is thermally treated to convert the precursor polymer into PPV, which acts as a charge transport layer in the structure. Other suitable conjugated polymers including derivatives of PPV are disclosed in U.S. Pat. No. 5,247,190, the contents of which are herein incorporated by reference. The second polymer coating 12 is deposited by spin coating a chloroform solution of a suitable poly (cyanoterephthalylidene) onto the. aluminium foil 10, and acts as the light emitting layer. In this case the self-supporting substrate acts directly as the electrode. Lamination of the two structure halves is induced by the simultaneous application of pressure and heating to 50° C. in a vacuum oven. In the finished device, electroluminescence was observed on application of a positive bias between the indium tin oxide and aluminium electrodes. There are many other combinations of emitting and charge transport layers that can be used in the laminating fabrication process. These include molecular materials such as Tris(8-hydroxyquinoline) aluminium which is sublimed, directly soluble conjugated polymer materials such as polyalkylthiophenes and alkoxy derivatives of PPV, oxadiazole-based molecular or polymer layers, conjugated polymer blends of electroluminescent and transport layers in one layer, molecular materials embedded in a polymer matrix and many other combinations. Suitable alternatives are described in the article by C. T. Tang, et al, referenced above, the contents of which are herein incorporated by reference.

Furthermore, different arrangements of the structure halves are possible.

In a possible embodiment, more than one polymer coating is provided on the self-supporting substrate 2 while only one coating is provided on the aluminium foil 10. Conversely, the aluminium foil may carry more than one polymer coating while more than one coating is applied to the self-supporting substrate 2.

Figure 6:
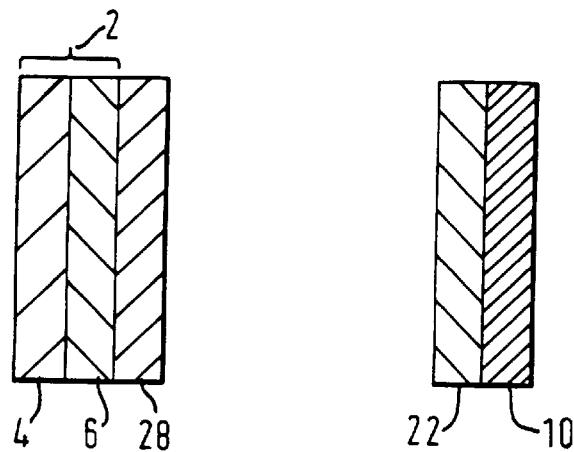
FIG. 6 is an exemplary structure in accordance with another embodiment of the invention.

FIG. 6 illustrates an embodiment where the charge transport compound is a layer of polyaniline 28. The light emissive material 22 carried by the second self-supporting substrate 10 is PPV.

Figure 7:
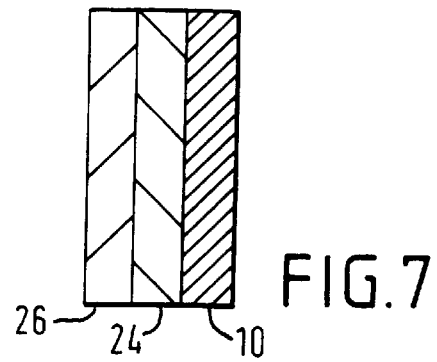
FIGS. 7 and 8 are respectively different arrangements for one of the self-supporting components to be used with the other self-supporting component as illustrated in FIG. 6.

FIG. 7 illustrates an alternative self-supporting component for use with the first self-supporting component shown on the left hand side of FIG. 6. Thus, FIG. 7 illustrates a thin sheet of aluminium foil 10 on which has been formed a layer 24 of cyanoPPV and a layer 26 of PPV. In that embodiment, the layer 26 of PPV acts as an additional semiconductive charge transport layer.

Semiconductive charge transport layers generally differentially transport charge carriers of opposite types (i.e. electrons or holes) and are used to improve the efficiency of the device by assisting in the balancing of electron and hole injection into the light emissive layer from the device electrodes. On the other hand, conductive charge transport layers transport charge carriers of both types (i.e. electrons and holes) and to that extent can be considered as forming part of the electrode of the device.

Figure 8:
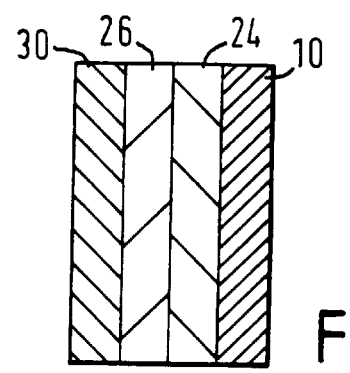

FIG. 8 illustrates the further possibility for a self-supporting substrate for use with the self-supporting component on the left hand side of FIG. 6. In FIG. 8, a thin sheet of aluminium foil 10 carries a coating 24 of cyanoPPV, a coating 26 of PPV and a coating 30 of polyaniline. In this embodiment, the layer 26 acts as a semiconductive charge transport layer whereas the layers 28 and 30 act as conductive charge transport layers.

Figure 9:
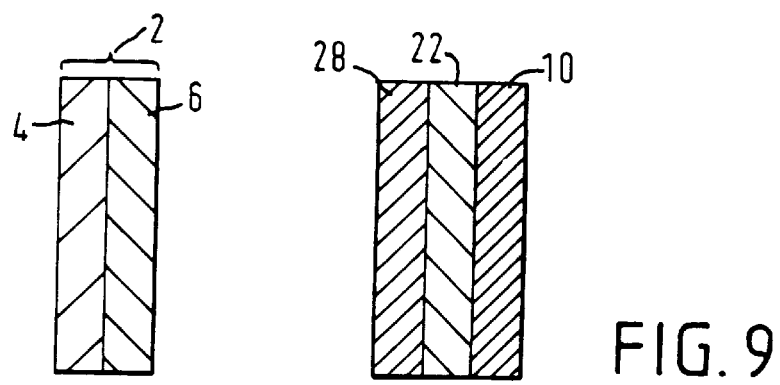
FIG. 9 is an exemplary structure of a different embodiment of the invention.

FIG. 9 is an exemplary structure in accordance with a different embodiment of the invention. In the embodiment of FIG. 9, the self-supporting substrate 2 carries no polymer layers. Instead, the self-supporting substrate 10 carries a layer 22 of PPV and a layer 28 of polyaniline. In that embodiment, the layer 22 of PPV acts as a light emissive layer while the layer 28 of polyaniline acts as a conducting charge transport layer.

Figure 4:
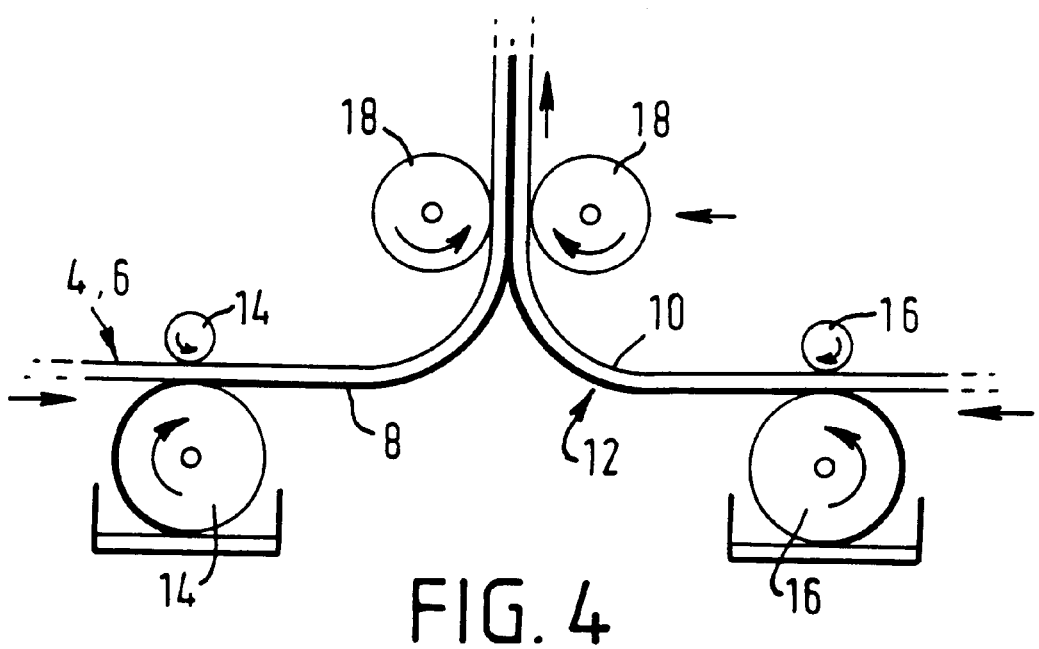
FIG. 4 is a diagram showing apparatus for performing the method of the invention.

FIG. 4 illustrates an apparatus suitable for carrying out a method laminating the structure halves. Reference numeral 14 denotes a pair of rollers which continuously apply the first polymer coating 8 to the indium tin oxide coated glass substrate 4. The rollers can apply the polymer coating by a deposition or printing process. Thus, a first self-supporting coated film is produced. Reference numeral 16 denotes a second pair of rollers which similarly apply the second polymer coating 12 to the aluminium foil 10. A second self-supporting, coated film is thus produced. The two self-supporting films are supplied to a third pair of heated rollers 18 which laminate the films together to produce a continuous laminated multilayer structure which forms the light emitting device.

Application of pressure and heat takes place simultaneously at the lamination rollers 18. This approach allows for production of low cost, large area displays.

Figure 5:
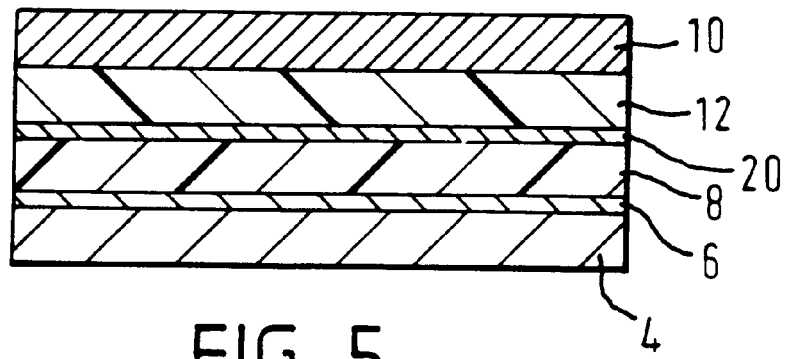
FIG. 5 is a diagram of a light emitting device.

In another embodiment the two structure halves are joined by the application of pressure and an adhesive layer applied to one of the structure halves. The adhesive layer is chosen to maximise the bonding between the structure halves for application of a given temperature and pressure, and to have a minimum impact on the performance of the light emitting diode. FIG. 5 shows a finished structure with an adhesive layer 20. Other like numerals denote like parts as in FIG. 3.

Other method and configurations of joining the two laminate halves are possible, including various combinations of pressure, heat, electric field, radiation (ultraviolet, visible, infra-red or microwave) and ultrasound. A range of possible lamination techniques and configurations is described in "Modern coating technology systems for paper, film and foil" by F. Shepherd published by EMAP Maclaren 1995.

The invention can be applied to any industrial application of light emitting polymers, particularly where flexible substrates may be used. Such industrial applications include (but are not confined to) backlights, alphanumeric displays, graphic displays, static displays and printheads.

We claim:

1. A method of making a light emitting device comprising the laminating together of two self-supporting components, at least one of which has a light emitting layer (12,22,24) on an inner surface thereof, whereby the light emitting layer is located between the components in the finished device, wherein a first one of the self-supporting components is formed by providing on a first substrate (10) a light emissive material constituting the light emitting layer; and the, step of laminating together the two self-supporting components is such that the light emissive material is located between the components in the finished device, characterised in that the light emissive material is an organic material;

a second one of the self-supporting components is formed by coating a second substrate (4) with an organic material (8,28) which is a charge transport material; and each of the self-supporting components includes a charge injecting electrode (6,10) for injecting charge carriers of respectively opposite types into the organic light emissive material.

2. A method according to claim 1 wherein either the first or the second substrate comprises a transparent supporting material (4) coated with indium tin oxide (6) to form a first electrode of the light emitting device.

3. A method according to claim 2 wherein the other one of the substrates comprises aluminium (10) acting as a second electrode.

4. A method according to claim 1 wherein said organic light emissive material is poly(phenylenevinylene) or a derivative thereof.

5. A method according to claim 4 wherein the light emissive material is cyanoPPV and the charge transport material is PPV.

6. A method according to claim 1 wherein the charge transport material is a conducting polymer.

7. A method according to claim 6 wherein an additional semiconductive charge transport layer (26) is provided on one of the self-supporting components prior to the laminating step.

8. A method according to claim 6 wherein the conducting polymer is selected from the group comprising polypyrrole, polyaniline, PPV and derivatives, polythiophene and derivatives.

9. A method according to claim 1 wherein the step of laminating together the two self-supporting substrates comprises simultaneously applying pressure and heat.

10. A method according to claim 1 wherein a layer of adhesive (20) is used to perform the laminating together of the two self-supporting substrates.

11. An organic light emitting device made in accordance with claim 1.

12. An organic light emitting device comprising a self-supporting substrate acting as a first electrode (10) and carrying a first organic semiconductive layer (12,22,24), a second self-supporting substrate acting as a second electrode (4,6) and carrying a second organic layer (8,28), and arranged between the first and second organic layers a layer of adhesive (20), wherein the first organic semiconductive layer is a light emitting layer and the second organic layer is a charge transport layer.

13. A method of making a light emitting device comprising the laminating together of two self-supporting components (2,10), one of which provides a first charge injecting electrode (10) for the device and is formed by coating a first substrate (10) with an organic light emissive material (22)

constituting a light emitting layer and a conducting polymer (28) constituting a charge transport layer, and the other of which provides a second charge injecting electrode (6) for the device, whereby the light emitting layer and the charge transport layer are located between the components in the finished device.

* * * * *